US012648356B2

(12) United States Patent
Hsu

(10) Patent No.: US 12,648,356 B2
(45) Date of Patent: Jun. 2, 2026

(54) ON-DIE TEMPERATURE CONTROL FOR SEMICONDUCTOR DIE ASSEMBLIES AND ASSOCIATED SYSTEMS AND METHODS

(71) Applicant: Micron Technology, Inc., Boise, ID (US)

(72) Inventor: Bang-Ning Hsu, Taichung (TW)

(73) Assignee: Micron Technology, Inc., Boise, ID (US)

( * ) Notice: Subject to any disclaimer, the term of this patent is extended or adjusted under 35 U.S.C. 154(b) by 811 days.

(21) Appl. No.: 17/865,264

(22) Filed: Jul. 14, 2022

(65) Prior Publication Data

US 2023/0060671 A1 Mar. 2, 2023

Related U.S. Application Data

(60) Provisional application No. 63/238,279, filed on Aug. 30, 2021.

(51) Int. Cl.
*H10N 19/00* (2026.01)
*H10N 10/01* (2023.01)
(Continued)

(52) U.S. Cl.
CPC ............. *H10N 19/00* (2023.02); *H10N 10/01* (2023.02); *H10N 10/17* (2023.02); *H10W 40/28* (2026.01)

(58) Field of Classification Search
CPC ....... H10N 19/00; H10N 10/01; H01L 23/345
See application file for complete search history.

(56) References Cited

U.S. PATENT DOCUMENTS 11,756,799 B1 * 9/2023 Schaedler ........... H01L 21/4857
257/668
2002/0170901 A1 * 11/2002 Lau ........................ H05K 7/20
219/209
(Continued)

FOREIGN PATENT DOCUMENTS

JP 2011044512 A 3/2011
JP 20090190563 * 3/2011 ............. H01L 21/60

OTHER PUBLICATIONS

Korean Patent Application No. 10-2022-0107347—Korean Office Action and Search Report, dated Aug. 29, 2024, with English Translation, 6 pages.

*Primary Examiner* — Ali Naraghi
(74) *Attorney, Agent, or Firm* — Dorsey & Whitney LLP

(57) ABSTRACT

On-die temperature control for semiconductor die assemblies, and associated systems and methods are disclosed. In an embodiment, a semiconductor device assembly includes first and second semiconductor dies directly bonded to each other. The semiconductor dies each includes conductive pads and resistive heating components in a dielectric layer, where the resistive heating components are located proximate to the conductive pads to supply localized thermal energy to the conductive pads in response to electric current flowing through the resistive heating components. In some embodiments, the conductive pads of the first semiconductor die are directly bonded to the conductive pads of the second semiconductor die at a first temperature less than a second temperature for the thermal expansion of the conductive pads absent the localized thermal energy generated by the resistive heating components.

9 Claims, 9 Drawing Sheets

(51) Int. Cl.
　　　*H10N 10/17*　　　　(2023.01)
　　　*H10W 40/28*　　　　(2026.01)

(56) References Cited

U.S. PATENT DOCUMENTS

| | | | | |
|---|---|---|---|---|
| 2004/0035840 A1* | 2/2004 | Koopmans | ............ | H01L 23/345 |
| | | | | 219/209 |
| 2006/0012033 A1* | 1/2006 | Noguchi | ............. | H01L 23/3114 |
| | | | | 438/126 |
| 2009/0272417 A1* | 11/2009 | Schulz-Harder | ..... | H10N 10/817 |
| | | | | 136/203 |
| 2010/0176506 A1* | 7/2010 | Hsu | ........................ | H01L 23/481 |
| | | | | 257/E23.101 |
| 2010/0278211 A1* | 11/2010 | Pu | ......................... | H01L 23/345 |
| | | | | 374/57 |
| 2011/0148267 A1* | 6/2011 | McDaniel | ............... | F25D 25/02 |
| | | | | 248/250 |
| 2012/0161336 A1* | 6/2012 | Lin | ........................ | H01L 23/345 |
| | | | | 257/782 |
| 2012/0275128 A1* | 11/2012 | Takada | ................. | H05K 1/0212 |
| | | | | 29/739 |
| 2013/0255741 A1* | 10/2013 | Edwards | ............... | H01L 23/345 |
| | | | | 438/54 |
| 2013/0337631 A1* | 12/2013 | Syue | ........................ | C30B 31/04 |
| | | | | 257/E21.546 |
| 2018/0130733 A1* | 5/2018 | Richard | ............... | H01L 23/345 |
| 2019/0148267 A1* | 5/2019 | Chen | .................. | H01L 21/6835 |
| | | | | 257/737 |

* cited by examiner

100A

100B

100C

200A

200B

<u>200C</u>

<u>200D</u>

600

425b

615b

615a

610

400b

400a

425a

430

800

```
┌─────────────────────────────────────────────────┐
│ Provide a first semiconductor die including a   │
│ first dielectric layer, where the first         │       810
│ dielectric layer includes a first bond pad with │
│ a first top surface exposed and recessed with   │
│ respect to a first surface of the first         │
│ dielectric layer, and where the first dielectric│
│ layer includes a resistive heating component    │
│ located proximate to the first bond pad         │
└─────────────────────────────────────────────────┘
```

```
┌─────────────────────────────────────────────────┐
│ Provide a second semiconductor die including a  │
│ second dielectric layer, where the second       │       815
│ dielectric layer includes a second bond pad with│
│ a second top surface exposed and recessed with  │
│ respect to a second surface of the second       │
│ dielectric layer                                │
└─────────────────────────────────────────────────┘
```

```
┌─────────────────────────────────────────────────┐
│ Attach the first and second semiconductor dies  │
│ such that the first surface is in contact with  │       820
│ the second surface to form a bonding interface  │
│ and the first bond pad is aligned to and facing │
│ the second bond pad                             │
└─────────────────────────────────────────────────┘
```

```
┌─────────────────────────────────────────────────┐
│ Apply electric current to the resistive heating │
│ component to supply thermal energy to at least  │       825
│ the first bond pad such that at least the first │
│ top surface of the first bond pad expands toward│
│ the bonding interface                           │
└─────────────────────────────────────────────────┘
```

*Figure 8*

ON-DIE TEMPERATURE CONTROL FOR SEMICONDUCTOR DIE ASSEMBLIES AND ASSOCIATED SYSTEMS AND METHODS

CROSS-REFERENCE TO RELATED APPLICATION(S)

The present application claims priority to U.S. Provisional Patent Application No. 63/238,279, filed Aug. 30, 2021, the disclosure of which is incorporated herein by reference in its entirety.

TECHNICAL FIELD

The present disclosure generally relates to semiconductor device assemblies, and more particularly relates to on-die temperature control for semiconductor die assemblies and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

FIG. 8 is a flowchart of a method of forming semiconductor die assemblies in accordance with embodiments of the present technology.

DETAILED DESCRIPTION

Figure 1:
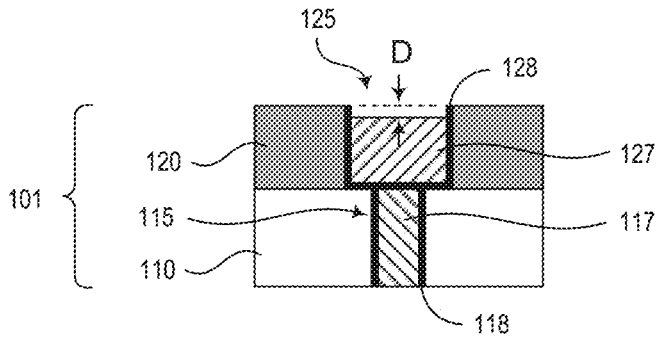
FIG. 1 illustrates various stages of process steps for direct bonding schemes.
Figure 1:
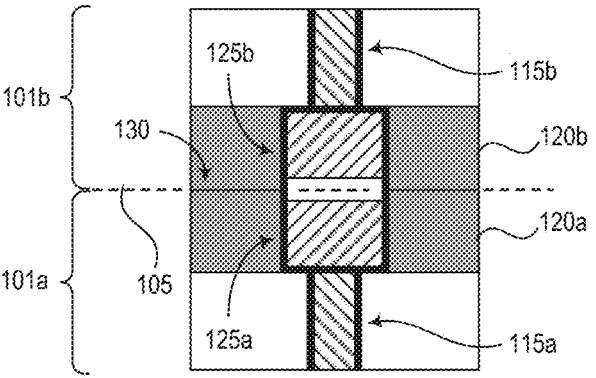
Figure 1:
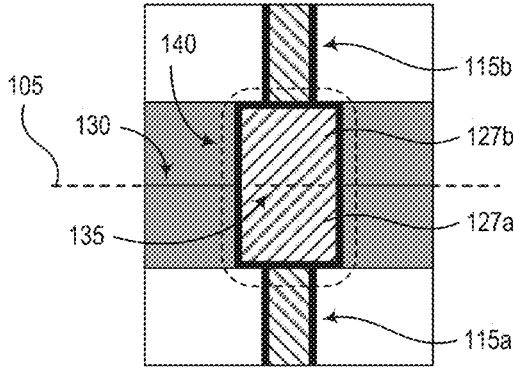

Specific details of several embodiments of on-die temperature control for semiconductor die assemblies, and associated systems and methods are described below. The term "semiconductor device or die" generally refers to a solid-state device that includes one or more semiconductor materials. Examples of semiconductor devices (or dies) include logic devices or dies, memory devices or dies, controllers, or microprocessors (e.g., central processing unit (CPU), graphics processing unit (GPU)), among others.

Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package substrate, a semiconductor device or die, or the like. Suitable steps of the methods described herein can be performed with processing steps associated with fabricating semiconductor devices (wafer-level and/or die-level) and/or manufacturing semiconductor packages.

Various computing systems or environments, e.g., high-performance computing (HPC) systems, require high bandwidth and low power consumption. Certain schemes of forming interconnects between semiconductor dies (e.g., a direct bonding scheme) may facilitate satisfying the requirements, as well as providing form-factors suitable for scaling physical dimensions (e.g., heights) of semiconductor die assemblies of the HPC systems. The direct bonding scheme includes individual conductive components (e.g., copper pads, conductive pads, bond pads) of a first semiconductor die (or a first wafer including the first semiconductor die) aligned and directly bonded to corresponding one of conductive components of a second semiconductor die (or a second wafer including the second semiconductor die).

Further, a dielectric material surrounding each of the conductive components of the first semiconductor die can be directly bonded to another dielectric material surrounding each of the conductive components of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other and hermetically seal the conductive components aligned to each other.

Subsequently, the semiconductor dies are annealed at an elevated temperature (e.g., post bond annealing process) such that the conductive materials of the conductive components can expand—e.g., swell vertically toward the bonding interface—at least partially due to the differences in coefficients of thermal expansion (CTE) between the conductive materials and the dielectric materials (which may be referred to as CTE-based expansion). Eventually, the conductive materials are conjoined to form permanent bonding between them—e.g., metallurgical bonding. Additionally, the dielectric materials may enhance their bonding strength during the post bond annealing process.

In some embodiments, the post bond annealing temperature may reach approximately 400° C. or higher. As the semiconductor dies include fully processed semiconductor components (e.g., diodes, metal-oxide-semiconductor field-effect-transistors (MOSFETs)), the additional thermal budget during the annealing process may degrade electrical characteristics of the semiconductor components and/or performance of the circuits including the semiconductor components (e.g., integrated circuitry). Accordingly, eliminating the post bond annealing process steps or reducing the post bond annealing process temperature may avoid risks to the semiconductor dies undergoing the direct bonding process steps.

The present technology provides localized thermal energy to facilitate CTE-based expansion of the conductive components (e.g., copper pads) such that the conductive components form metallurgical bonding at a lower post bond annealing temperature (or without the post bond annealing process, in some cases). The localized thermal energy may be sufficiently far from the integrated circuitry so as to avoid or reduce adverse effects stemming from the localized thermal energy. Accordingly, the present technology can mitigate risks associated with the thermal budget during the hybrid bonding process steps.

The localized thermal energy may be obtained using a resistive heating component located proximate to the conductive components, where the resistive heating component is configured to generate the heat for the conductive components during the hybrid bonding process, for example, in response to electric current flowing through the resistive heating component. In this manner, in some embodiments, the localized thermal energy supplements the thermal energy provided by the post bond annealing process—e.g., lowering the temperature during the post bond annealing process. In some embodiments, the localized thermal energy generated by the resistive heating component may suffice to replace the thermal energy provided by the post bond annealing process, thereby eliminating the post bond annealing process.

In some embodiments, the resistive heating component may be a part of a thermoelectric component of the semiconductor die—e.g., a Peltier device including a hetero-junction of two different metals, in which one of the metals corresponds to the resistive heating component. The thermoelectric component can be configured to either generate heat or cool down during the semiconductor die operation—e.g., responsive to different bias conditions applied across the hetero-junction. In some embodiments, the semiconductor dies include such a thermoelectric component without the resistive heating component. For example, none of the metals forming the hetero-junction corresponds to the resistive heating component and the thermoelectric component is inactive during the hybrid bonding process.

Moreover, the thermoelectric component can be coupled to a temperature control circuit of the semiconductor die so as to provide localized temperature control for the semiconductor die during the operation of the semiconductor die. Additionally, or alternatively, the thermoelectric component can be coupled to a bond pad of the semiconductor die, which can be couple with a terminal (e.g., a terminal of a ball-grid-array (BGA)) of a semiconductor die assembly including the semiconductor die. In this manner, an external device (e.g., a host device) coupled with the semiconductor die assembly may operate the thermoelectric component to provide localized temperature control for the semiconductor die during the operation of the semiconductor die assembly.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 illustrates various stages of process steps for direct bonding schemes. Diagram 100A illustrates a portion of a semiconductor die 101 with a substrate 110 having integrated circuitry (not shown) and a through-substrate via (TSV) 115 coupled with the integrated circuitry. In some embodiments, the TSV 115 includes a first conductive material 117 (e.g., tungsten) and a conductive barrier layer 118 (e.g., TiN). The semiconductor die 101 also includes a conductive pad 125 (which may also be referred to as a bond pad) formed in a dielectric layer 120 (e.g., silicon oxides, silicon nitrides, silicon carbon nitrides, silicon carbonates, or a combination thereof). The conductive pad 125 is electrically connected to the TSV 115 (and to the integrated circuitry through the TSV 115). In some embodiments, the conductive pad 125 includes a second conductive material 127 (e.g., copper) and another conductive barrier layer 128 (e.g., TaN).

The conductive pad 125 depicted in diagram 100A includes a surface recessed by a depth D with respect to the surface of the dielectric layer 120 (i.e., the surface opposite to the substrate 110). In some embodiments, CMP process steps are used to form the conductive pad 125, and the recess may be a result of the CMP process. For example, the recess may be formed during over-polishing steps that remove excessive conductive material 127 on the surface of the dielectric layer 120. Moreover, the amount of recess (e.g., the recess depth D) may be targeted to ensure the surface of the conductive pad 125 not to protrude above the surface of the dielectric layer 120—e.g., to avoid such protruded conductive pads 125 interfering with the bonding process described with reference to diagram 100B. The amount of recess may be targeted to be within a certain range such that the conductive materials 127 can form an interconnect 140 as described with reference to diagram 100C without compromising the bonding integrity.

Diagram 1008 illustrates two semiconductor dies 101a and 101b (or two wafers including the semiconductor dies 101a and 101b) that are attached together such that dielectric materials of the top semiconductor die 101b and bottom semiconductor die 101a adhere to each other to form dielectric-to-dielectric bonding 130 at the bonding interface 105. In some embodiments, the dielectric surfaces are activated (e.g., using a plasma treatment process) to facilitate the bonding of the dielectric surfaces. Also, conductive pads (e.g., the top conductive pad 125b and the bottom conductive pad 125a) of the top and bottom semiconductor dies 101a and 101b are aligned to face each other but are not connected to each other due to the recessed surfaces of the conductive pads 125a/b.

Diagram 100C illustrates that the bonded dies/wafers are annealed in an elevated temperature (e.g., around 400° C.) such that the conductive materials of the top and bottom conductive pads 125a/b may expand toward each other in response to receiving thermal energy during the post bond annealing process (e.g., due to the mismatch in CTEs between the conductive materials and the dielectric materials) within the open space defined by the recess surfaces and the dielectric material surrounding the conductive pads 125a/b.

When the surfaces of the top and bottom conductive materials are in contact as a result of the CTE-based expansion, the conductive materials are conjoined (e.g., via atomic migration (intermixing, diffusion) from one conductive material to another conductive material) to form metal-to-metal bonding 135—e.g., metallurgical bonding, permanent bonding. Once the metallurgical bonding is formed between the conductive pads 125a/b (thus, forming the interconnect 140), the conductive materials do not separate (or sever) when the bonded dies/wafers are brought to the ambient temperature or operating temperatures of the semiconductor die assemblies. In this manner, the bonding interface 105 includes the dielectric-to-dielectric bonding 130 and the metal-to-metal bonding 135.

Figure 2A:
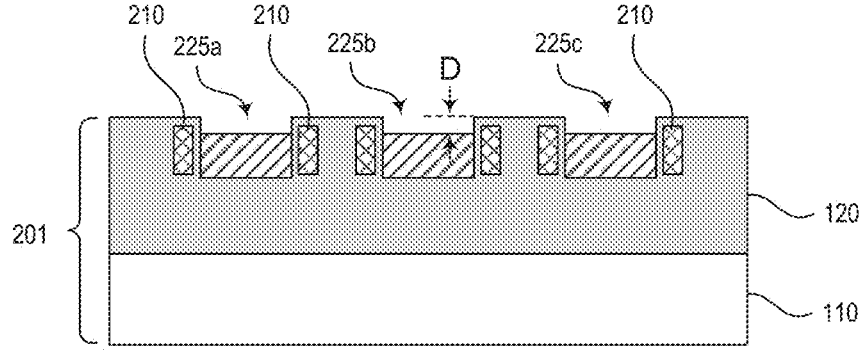
FIGS. 2A and 2B illustrate example schematic diagrams depicting stages of forming semiconductor die assemblies in accordance with embodiments of the present technology.
Figure 2A:
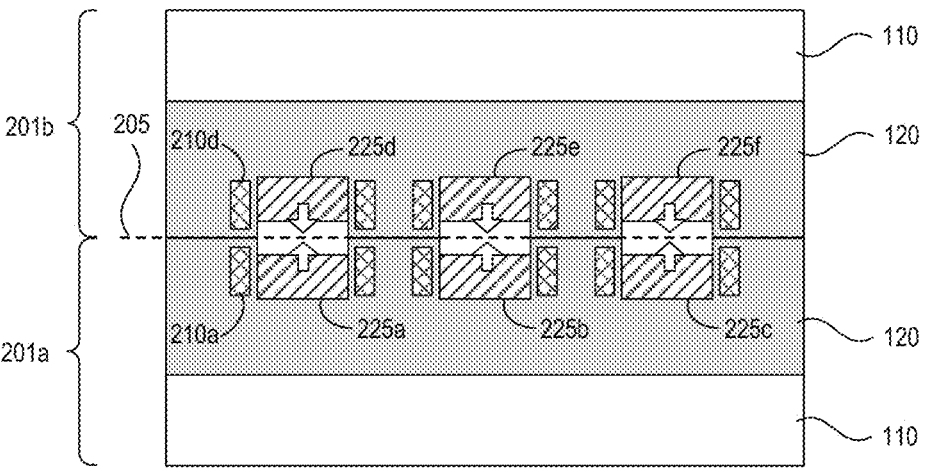
Figure 2B:
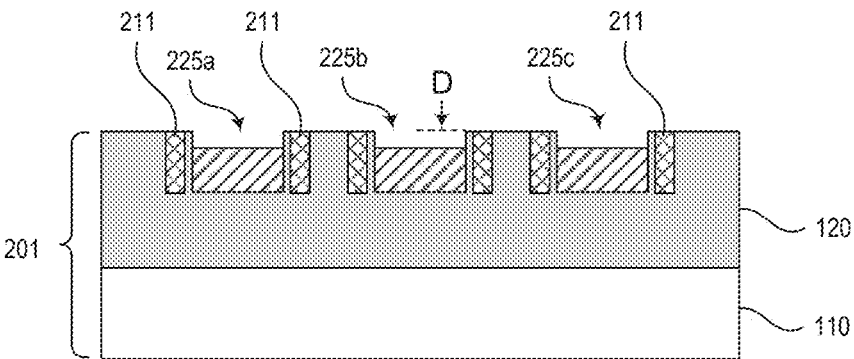
Figure 2B:
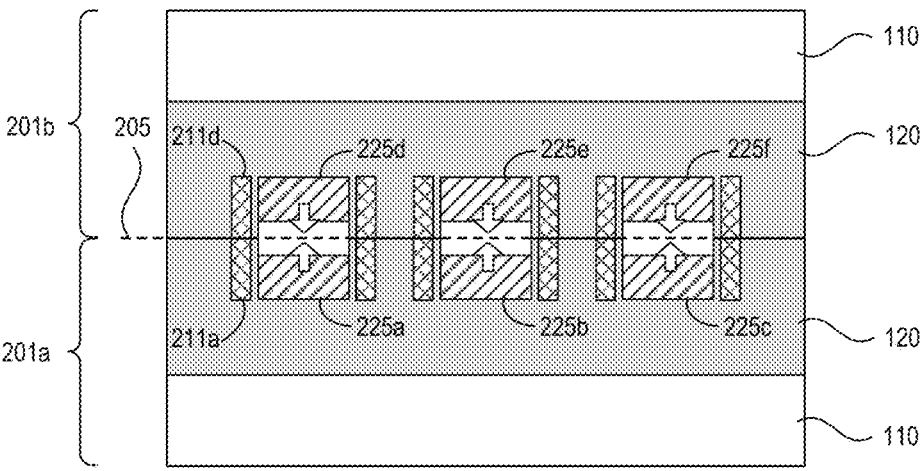

FIGS. 2A and 2B illustrate example schematic diagrams 200A through 200D depicting stages of forming semiconductor die assemblies in accordance with embodiments of the present technology. Diagram 200A illustrates a portion of a semiconductor die 201, which may be an example of or include aspects of the semiconductor die 101 described with reference to FIG. 1. For example, the semiconductor die 201 includes the substrate 110 having integrated circuitry (not shown) and the dielectric layer 120.

The semiconductor die 201 also includes one or more conductive pads 225 (also identified individually as 225a-c) formed in the dielectric layer 120. The conductive pads 225 may be examples of or include aspects of the conductive pads 125 described with reference to FIG. 1. The TSVs 115 coupling the conductive pads 225 to the integrated circuitry are omitted in FIGS. 2A and 2B. The conductive pad 225 has a surface recessed with respect to the surface of the dielectric layer 120 (the amount of recess denoted as D)—e.g., as a result of the CMP process described with reference to FIG. 1. As shown in diagram 200A, the surface of the conductive pad 225 is uncovered (i.e., exposed).

The semiconductor die 201 also includes resistive heating components 210 in the dielectric layer 120. The resistive heating components 210 are electrically isolated from the conductive pads 225. Further, the resistive heating components 210 are electrically isolated from every external contact on a top or bottom surface of the semiconductor die 201. The resistive heating components 210 may be located proximate to the conductive pads 225 such that the resistive heating components 210 can supply localized thermal energy to the conductive pads 225 during the hybrid bonding process in response to electric current flowing through the resistive heating components 210. In some embodiments, the resistive heating components 210 include at least one of nickel alloys, NiCr alloys, FeCrAl alloys, CuNi alloys, molybdenum alloys, tungsten alloys, graphite, silicon carbides, or $MoSi_2$. As described in more detail with reference to FIGS. 4 through 6, all the resistive heating components 210 of the semiconductor die 201 may be connected to a single circuit such that the electric current can be concurrently supplied to all the resistive heating components 210. Moreover, the electric current can be supplied by an external power supply coupled with the resistive heating components 210.

Diagram 200B illustrates two semiconductor dies 201a and 201b (or two wafers including the semiconductor dies 201a and 201b) that are attached together to form the bonding interface 205 as described with reference to FIG. 1 (e.g., diagram 100B). As shown in diagram 200B, two semiconductor dies 201a and 201b are arranged such that the conductive pads 225 of the semiconductor dies 201a and 201b are aligned to each other—e.g., the conductive pad 225a aligned to the conductive pad 225d. The resistive heating components 210 are embedded in the dielectric layer 120 such that the dielectric-to-dielectric bonding area is not reduced due to the presence of the resistive heating components 210. As such, the resistive heating components 210 of the semiconductor die 201a are electrically isolated from the resistive heating components 210 of the semiconductor die 201b.

Subsequently, the resistive heating components 210 may be activated (e.g., by supplying electric current to the resistive heating components 210) to provide heat energy (e.g., localized thermal energy) to the conductive pads 225. The resistive heating components 210 of the semiconductor die 201a and the resistive heating components 210 of the semiconductor die 201b may be separately activated as they are electrically isolated from each other. As a result of activating the resistive heating components 210, the CTE-based expansion of the conductive pads 225 may occur as indicated with arrows pointing toward the bond interface 205. For example, the resistive heating component 210a provides localized thermal energy to the conductive pad 225a (and to the conductive pad 225d, in some cases). The semiconductor dies 201a and 201b (or the wafers including the semiconductor dies 201a and 201b) may also be brought to an elevated temperature to facilitate the CTE-based expansion of the conductive pads 225.

The surface of the conductive pads 225 may expand toward the surface of the dielectric layer 120 (toward the bonding interface 205) in response to receiving the localized thermal energy provided by the resistive heating components 210. In some embodiments, the surface of the conductive pad 225 expands to (or past) the surface of the dielectric layer 120 (or the bonding interface 205) in response to receiving the localized thermal energy provided by the resistive heating component 210. In such embodiments, the localized thermal energy provided by the resistive heating components 210 is sufficient to form metallic bonding interface between the conductive pads 225—e.g., between the conductive pads 225a and 225d. Thus, a post bond annealing process may be omitted.

In some embodiments, the surface of the conductive pad 225 expands toward the surface of the dielectric layer 120 (toward the bonding interface 205) in response to receiving the localized thermal energy provided by the resistive heating component 210, but may not reach the bonding interface 205. In such embodiments, the localized thermal energy provided by the resistive heating components 210 is insufficient to form metallic bonding interface between the conductive pads 225—e.g., between the conductive pads 225*a* and 225*d*.

As such, a post bond annealing process may be carried out to form the metallic bonding interface in addition to activating (e.g., applying electric current to) the resistive heating components 210. The post bonding annealing process may brought the attached semiconductor dies 201*a/b* to a temperature (e.g., 200° C., 250° C., 300° C., or the like) less than the temperature (e.g., 380° C., 400° C., 420° C., or the like) for the conductive pads 225 to directly bond to each other absent the localized thermal energy provided by the resistive heating components 210. In other words, the localized thermal energy provided by the resistive heating components 210 may be a portion of the total thermal energy for the surface of the conductive pad 225 to expand to the surface of the dielectric layer 120 (or past the surface of the dielectric layer 120) to form the metal-to-metal bonding at the bonding interface 205.

Diagram 200C illustrates that the resistive heating components may have an exposed surface. For example, the resistive heating components 211 (in comparison with the resistive heating components 210 embedded in the dielectric layer 120) have a surface that is coplanar with the surface of the dielectric layer 120. As with the resistive heating component 210, the resistive heating components 211 are electrically isolated from the conductive pads 225 and from every external contact on a top or bottom surface of the semiconductor die 201. Moreover, all the resistive heating components 211 may be connected to a single circuit such that the electric current can be concurrently supplied to all the resistive heating components 211.

Diagram 200D illustrates that the resistive heating components 211 of semiconductor dies 201*a* (e.g., the resistive heating component 211*a*) can be aligned and in contact with corresponding resistive heating components 211 (e.g., the resistive heating component 211*d*) of semiconductor dies 201*b* when the semiconductor dies 201*a* and 201*b* are attached to each other. In this manner, the resistive heating components 211 of the semiconductor dies 201*a* and 201*b* can be concurrently activated—e.g., flowing the electric current to the resistive heating components 211. The dielectric-to-dielectric bonding area at the bonding interface 205, however, may be reduced by the presence of the resistive heating components 211 occupying a portion of the dielectric-to-dielectric bonding area.

Although the foregoing example schematic diagrams illustrate both semiconductor dies 201*a/b* having the resistive heating components 210/211, the present technology is not limited thereto. For example, one of the semiconductor dies 201*a* or 201*b* may not include the resistive heating components 210/211.

Figure 3:
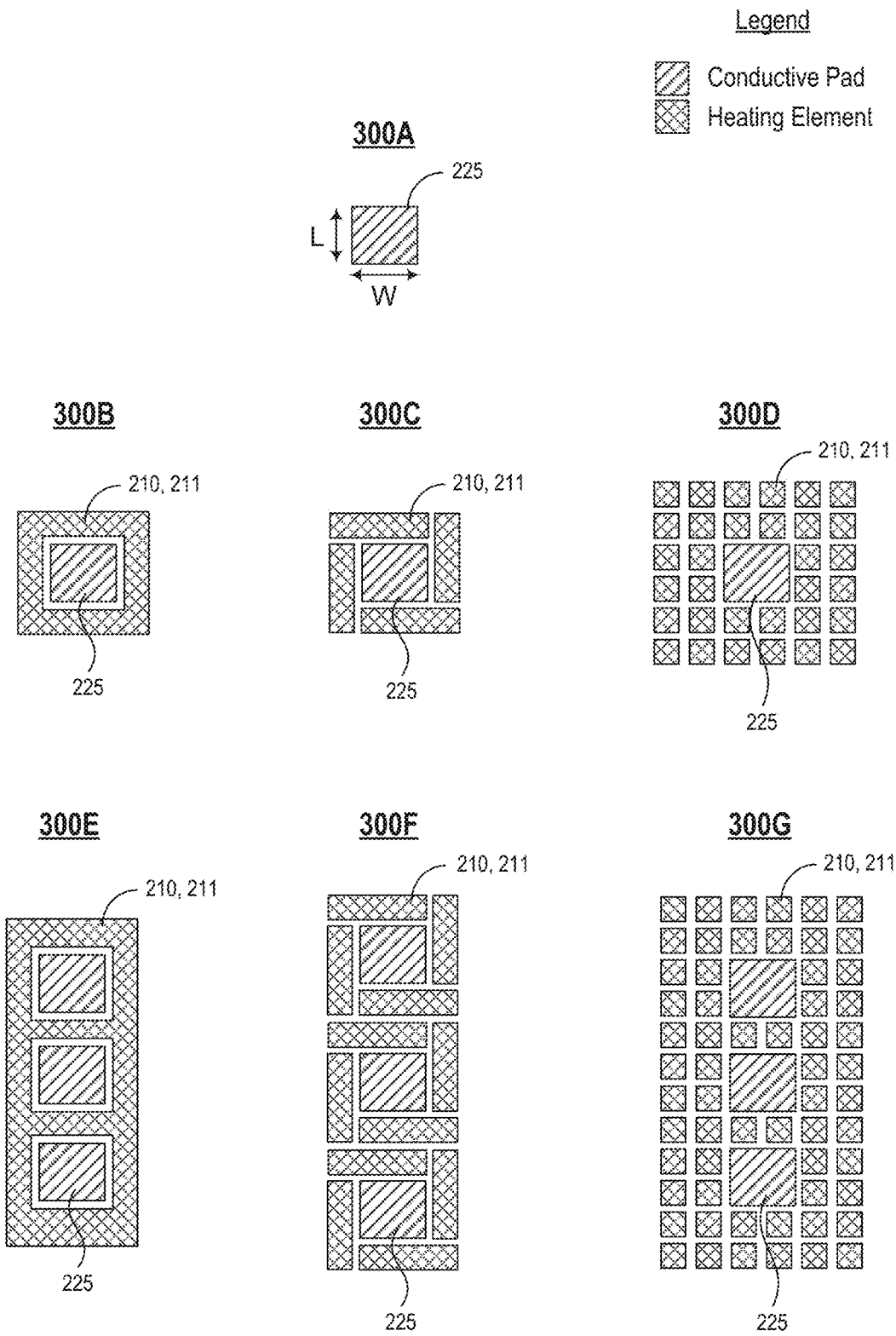
FIG. 3 illustrates top-down views of conductive pads of semiconductor dies in accordance with embodiments of the present technology.

FIG. 3 illustrates top-down views of conductive pads 225 of semiconductor dies (e.g., the semiconductor die 201) in accordance with embodiments of the present technology. Diagram 300A depicts a conductive pad 225 (a copper pad, a bond pad, a conductive component) having a width (W) and a length (L). In some embodiments, the width and length are comparable as depicted in diagram 300A. In other embodiments, the width and length are dissimilar (e.g., elongated rectangles). In some embodiments, the width (and/or length) can be less than 1 micrometer (μm). The shape and dimensions of the conductive pad 225 described with reference to FIG. 3 are examples only and the present technology is not limited thereto. For example, conductive pads 225 may have footprints (layout) resembling circles, ellipses, race-tracks, rectangles with dissimilar widths and lengths, or any polygon shapes. Further, the conductive pad 225 can have widths greater than 1, 5, 10 μm, or even greater.

Diagrams 300B through 300D illustrate various arrangements of resistive heating components 210/211 surrounding the conductive pads 225. Diagrams 300B, 300C, and 300D may correspond to a top-down view of one of the conductive pads 225 depicted in diagram 200A/B (or 200B/D), where the resistive heating components 210/211 are located proximate to the conductive pads 225. For example, diagram 300B illustrates the resistive heating component 210/211 surrounding (encircling) the conductive pad 225. Diagram 300C illustrates that the resistive heating components 210/211 surrounding the conductive pad 225 includes multiple strips. Diagram 300D illustrates that the resistive heating components 210/211 surrounding the conductive pad 225 includes multiple patterns of squares or rectangles (which may be referred to as a sea of squares/rectangles), where one or more square/rectangle patterns at least partially overlapping the conductive pad 225 are removed—e.g., during the layout of the conductive pads 225.

In some embodiments, the resistive heating components 210/211 may be located in one or more regions of the semiconductor dies where the conductive pads 225 are located. For example, some semiconductor dies (e.g., the semiconductor die 201) may include the conductive pads 225 located in certain regions (e.g., a central region, peripheral regions, one or more regions near edges) of the semiconductor dies—e.g., for compact layouts of the semiconductor dies, for efficient signal routing schemes. FIG. 3 includes diagrams 300E through 300G depicting such regions of the semiconductor dies (e.g., regions including three (3) conductive pads 225). Although diagrams 300E through 300G illustrate three (3) conductive pads 225 in such regions as examples, the present technology is not limited thereto. For example, the region where the conductive pads are located may include several tens of conductive pads, several hundreds of conductive pads, or even more.

Figure 4:
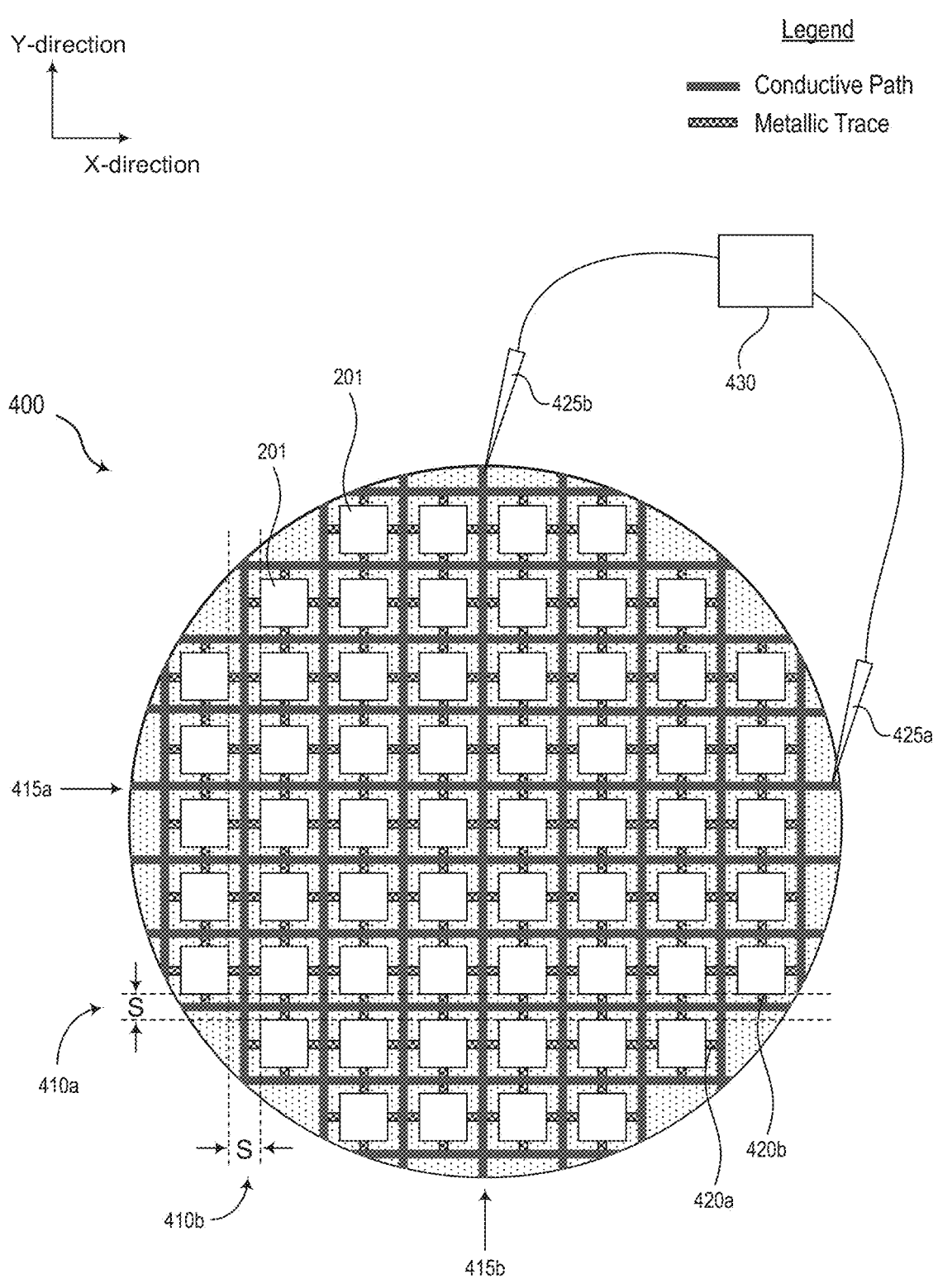
FIG. 4 illustrates a top-down diagram of a semiconductor wafer including semiconductor dies in accordance with embodiments of the present technology.

FIG. 4 illustrates a top-down diagram of a semiconductor wafer 400 including semiconductor dies 201 in accordance with embodiments of the present technology. The semiconductor wafer 400 includes scribe lines 410 (also identified individually as a scribe line 410*a* extending in X-direction and a scribe line 410*b* extending in Y-direction). Each scribe line may include a conductive path 415 (also identified individually as a conductive paths 415*a* extending in X-direction and a conductive paths 415*b* extending in Y-direction).

In some embodiments, the conductive paths 415 include multiple levels of metals and vias that are concurrently built with the metals and vias of the semiconductor dies 201. The conductive paths 415 may extend to an edge of the semiconductor wafer 400 and can be configured to connect to an external connector 425 (also identified individually as external connectors 425*a/b*) at the edge. Further, the external connectors 425 are connected to an electrical power supply 430.

The scribe lines 410 also includes metallic traces 420 (also identified individually as a metallic trace 420*a* extending in X-direction and a metallic trace 420*b* extending in Y-direction). The metallic traces 420 are configured to couple the conductive paths 415 with the resistive heating components 210/211 of the semiconductor dies 201 as described in more detail below with reference to FIG. 5.

The conductive paths 415 are configured to form a network connecting the resistive heating components 201/211 of individual semiconductor dies 201 through the metallic traces 420 such that the external connectors 425 connected to the network can supply electric current to the resistive heating components 201/211 of individual semiconductor dies 201 when activated. In this manner, the power supply 430 can be operatively connected to the resistive heating components 210/211 of individual semiconductor dies 201 such that the power supply 430 can provide electric current to the resistive heating components 210/211 to generate localized thermal energy during hybrid bonding process steps. In other words, all the resistive heating components 210/211 of the semiconductor die 201 are connected to a single circuit such that the electric current can be concurrently supplied to all the resistive heating components 210/211.

Figure 5:
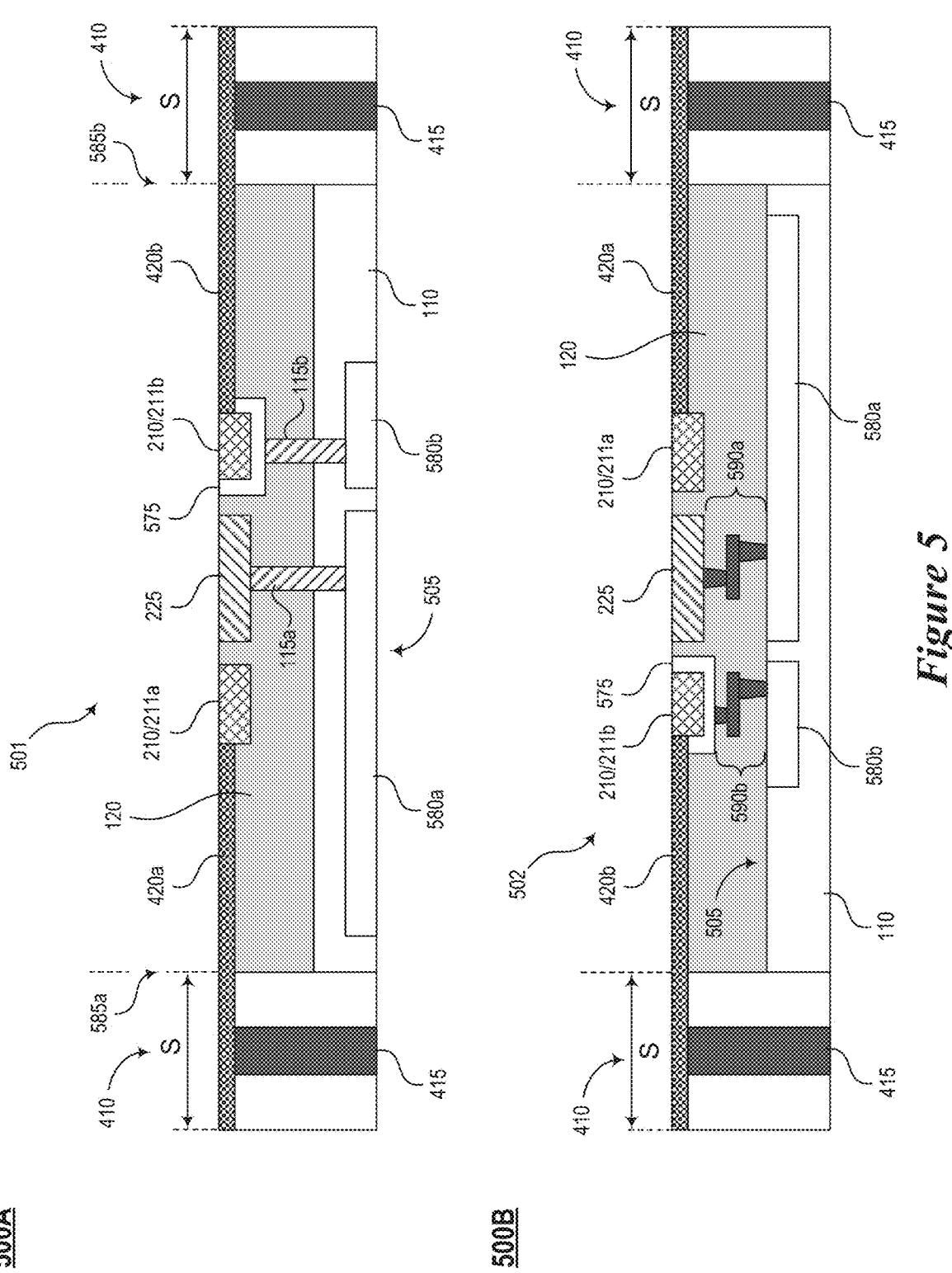
FIG. 5 illustrates cross-sectional schematic diagrams of semiconductor dies in accordance with embodiments of the present technology.

FIG. 5 illustrates cross-sectional schematic diagrams 500A and 500B of semiconductor dies 501 and 502, respectively, in accordance with embodiments of the present technology. The semiconductor dies 501/502 may be examples of or include aspects of semiconductor dies 201 and/or 101 described with reference to FIGS. 1, 2A, and 2B. For example, the semiconductor dies 501 and 502 each includes a substrate 110 having integrated circuitry 580. Further, the semiconductor dies 501 and 502 each includes a dielectric layer 120 having a conductive pad 225 and resistive heating components 210/211 (also identified individually as resistive heating components 210/211a, 210/211b) described with reference to FIGS. 2A and 2B. Moreover, diagrams 500A and 500B depict the semiconductor dies 501/502 before they are singulated (e.g., diced through the scribe lines 410). As such, the scribe lines 410 are shown next to the semiconductor dies 501/502.

Diagram 500A depicts the semiconductor die 501 including a TSV 115a that couples the conductive pad 225 with the integrated circuitry 580a located in the front side 505 of the semiconductor die 501. As such, diagram 500A illustrates the conductive pad 225 (and the resistive heating components 210/211) located in the back side of the semiconductor die 501. The semiconductor die 501 includes the resistive heating components 210/211 that are located proximate to the conductive pad 225 such that the resistive heating components 210/211 can provide localized thermal energy to the conductive pad 225 during the hybrid bonding process steps. The resistive heating components 210/211 are electrically isolated from the conductive pad 225, but connected to the metallic traces 420 (also identified individually as metallic traces 420a/b), which are connected to the conductive paths 415 in the scribe lines 410.

As described with reference to FIG. 4, the conductive paths 415 can be connected to an electrical power supply (e.g., the power supply 430) during the hybrid bonding process steps. In this manner, the electrical power supply can be coupled with the resistive heating components 210/211 such that the resistive heating components 210/211 can generate localized thermal energy for the conductive pad 225 during the hybrid bonding process, in response to electric current flowing through the resistive heating components 210/211.

After the hybrid bonding process, the semiconductor die 501 may be singulated—e.g., the semiconductor wafer 400 diced through the scribe lines 410 to generate individual semiconductor dies 501. After the singulation, the metallic traces 420a/b are separated from the conductive paths 415 in the scribe lines 410. As such, the metallic traces 420a/b may be terminated (severed) at locations 585a/b that correspond to the sidewalls of the semiconductor die 501.

In some embodiments, certain resistive heating components 210/211 (e.g., the resistive heating component 210/211b) may also be a part of a thermoelectric component 575 of the semiconductor die 501—e.g., a Peltier device including a hetero-junction of two different metals, in which one of the metals corresponds to the resistive heating component. The thermoelectric component 575 can be operatively coupled to a temperature control circuit (e.g., integrated circuitry 580b) of the semiconductor die 501. In this manner, the resistive heating component 210/211b can supply the localized thermal energy to the conductive pad 225 during the hybrid bonding process steps (e.g., based on the electric current through the metallic trace 420b), and can control the local temperature in the vicinity of the conductive pad 225 during the operation of the semiconductor die 501 (e.g., under the control of the temperature control circuit).

In other embodiments, the resistive heating component 210/211b may not be coupled to the metallic trace 420b. In such embodiments, the resistive heating component 210/211b does not provide the localized thermal energy to the conductive pad 225 during the hybrid bonding process steps, but can control the local temperature in the vicinity of the conductive pad 225 during the operation of the semiconductor die 501 (e.g., under the control of the temperature control circuit).

Additionally, or alternatively, the thermoelectric component 575 of the semiconductor die 501 may be coupled to another bond pad (not shown) of the semiconductor die 501, which can be configured to couple with a terminal of a semiconductor die assembly including the semiconductor die 501. In this manner, a host device coupled to the semiconductor die assembly can control the thermoelectric component 575 of the semiconductor die 501 during the operation of the semiconductor die assembly.

Diagram 500B depicts the semiconductor die 502, in comparison with the semiconductor die 501, including interconnect structures 590 (also identified individually as interconnect structures 590a/b) that couples the conductive pad 225 with the integrated circuitry 580a located in the front side 505 of the semiconductor die 501. The interconnect structures 590 includes one or more metal layers and vias. As such, diagram 500B illustrates the conductive pad 225 (and the resistive heating components 210/211) located in the front side of the semiconductor die 502. The descriptions directed to the resistive heating components 210/211 provided for the semiconductor die 501 are applicable to the semiconductor die 502 except that the conductive pad 225, the resistive heating components 210/211, and the metallic traces 420 are located in the dielectric layer 120 formed on the front side 505 of the semiconductor die 502.

Figure 6:
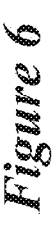
FIG. 6 illustrates a schematic diagram of an apparatus in accordance with embodiments of the present technology.

FIG. 6 illustrates a schematic diagram of an apparatus 600 in accordance with embodiments of the present technology. The apparatus 600 includes a chamber 610 configured to be heated. In some embodiments, the chamber 610 can be heated to various temperatures—e.g., 200° C., 250° C., 300° C., 350° C., 380° C., 400° C., 420° C., or the like. The apparatus 600 also includes a bonding head 615a in the chamber 610, which is configured to support a pair of semiconductor wafers 400 (also identified individually as semiconductor wafers 400a/b) attached to each other. The pair of semiconductor wafers 400a and 400b may correspond to the pair of semiconductor wafers including the semiconductor dies 201a/b as described with reference to diagrams 200B and 200D of FIGS. 2A and 2B. The semiconductor wafers 400a and 400b each includes a plurality of semiconductor dies (e.g., semiconductor dies 201, 501, 502) and a plurality of scribe lines (e.g., scribe lines 410) between the semiconductor dies, where the scribe lines include conductive paths (e.g., conductive paths 415) coupled with resistive heating components (e.g., the resistive heating components 210/211) of the semiconductor dies.

Moreover, at least one semiconductor wafer of the pair (e.g., semiconductor wafer 400*a*) include at least two of the scribe lines uncovered by the other semiconductor wafer of the pair (e.g., semiconductor wafer 400*b*) such that a pair of connectors (e.g., connectors 425*a/b*) in the chamber can connect to the conductive paths of the at least two uncovered scribe lines. The pair of connectors are further coupled with an external electrical power supply 430 such that the pair of connectors can provide electrical power (e.g., electric current) to the resistive heating components from the external electrical power supply. In some embodiments, the apparatus includes another bonding head (e.g., bonding head 615*b*) such that the bonding heads can apply pressure to the pair of semiconductor wafers.

Figure 7:
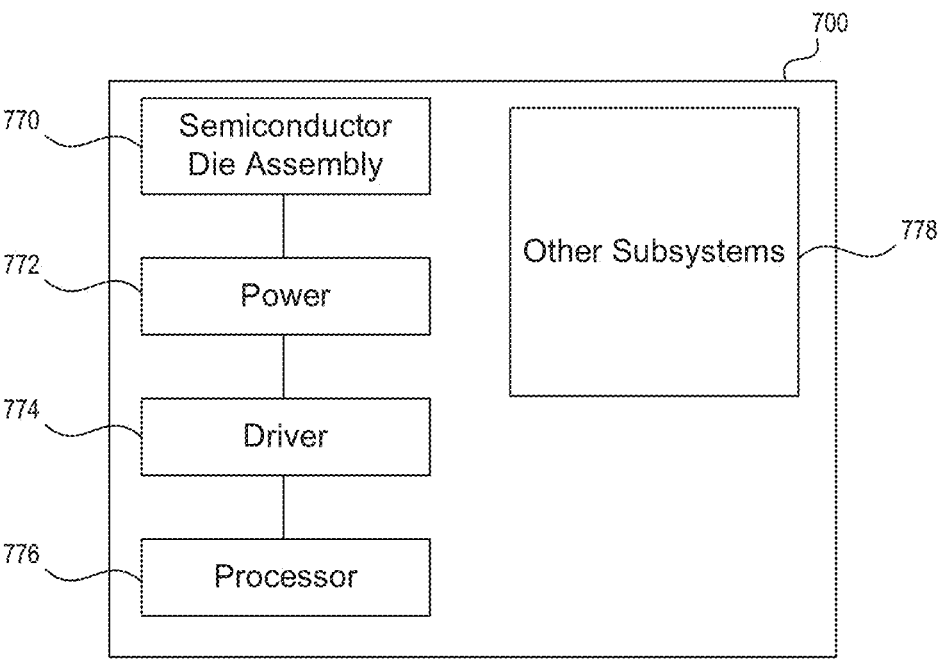
FIG. 7 is a block diagram schematically illustrating a system including a semiconductor die assembly in accordance with embodiments of the present technology.

FIG. 7 is a block diagram schematically illustrating a system 700 including a semiconductor die assembly in accordance with embodiments of the present technology. The system 700 can include a semiconductor device assembly 770, a power source 772, a driver 774, a processor 776, and/or other subsystems or components 778. The semiconductor device assembly 770 can be incorporated into any of a myriad of larger and/or more complex systems, a representative example of which is the system 700 shown schematically in FIG. 7. The semiconductor die assembly described with reference to FIGS. 2A and 2B may be included in the semiconductor device assembly 770 of the system 700.

The semiconductor device assembly 770 can have features generally similar to the semiconductor die assembly described above with reference to FIGS. 2A and 2B. For example, the semiconductor device assembly 770 includes two semiconductor dies (e.g., a first semiconductor die 201*a* and a second semiconductor die 201*b*) that are directly bonded to each other. The semiconductor dies each includes conductive pads and resistive heating components in a dielectric layer, where the resistive heating components are located proximate to the conductive pads to supply localized thermal energy to the conductive pads in response to electric current flowing through the resistive heating components.

In some embodiments, the conductive pads of the first semiconductor die (e.g., conductive pads 225*a-c*) are aligned and directly bonded to the corresponding conductive pads of the second semiconductor die (e.g., conductive pads 225*d-f*) based, at least in part, on CTE-based thermal expansion of the conductive pads to conjoin at the bonding interface in response to the localized thermal energy generated by the resistive heating components. In some embodiments, the conductive pads of the first semiconductor die are directly bonded to the conductive pads of the second semiconductor die at a first temperature less than a second temperature for the thermal expansion of the conductive pads absent the localized thermal energy generated by the resistive heating components.

The resulting system 770 can perform any of a wide variety of functions, such as memory storage, data processing, and/or other suitable functions. Accordingly, representative systems 770 can include, without limitation, handheld devices (e.g., mobile phones, tablets, digital readers, and digital audio players), computers, and appliances. Components of the system 770 may be housed in a single unit or distributed over multiple, interconnected units (e.g., through a communications network). The components of the system 770 can also include remote devices and any of a wide variety of computer readable media.

FIG. 8 is a flowchart 800 of a method of forming semiconductor die assemblies in accordance with embodiments of the present technology. The flowchart 800 may include aspects of methods as described with reference to FIGS. 1 through 6.

The method comprises providing a first semiconductor die including a first dielectric layer, where the first dielectric layer includes a first bond pad with a first top surface exposed and recessed with respect to a first surface of the first dielectric layer, and where the first dielectric layer includes a resistive heating component located proximate to the first bond pad (box 810). The method further comprises providing a second semiconductor die including a second dielectric layer, where the second dielectric layer includes a second bond pad with a second top surface exposed and recessed with respect to a second surface of the second dielectric layer (box 815). The method further comprises attaching the first and second semiconductor dies such that the first surface is in contact with the second surface to form a bonding interface and the first bond pad is aligned to and facing the second bond pad (box 820). The method further comprises applying electric current to the resistive heating component to supply thermal energy to at least the first bond pad such that at least the first top surface of the first bond pad expands toward the bonding interface (box 825).

In some embodiments, the thermal energy is sufficient for the first and second top surfaces of the first and second bond pads to bond to each other as a result of supplying the thermal energy to the first and/or second bond pads. In some embodiments, both the first and second top surfaces of the first and second bond pads expand toward to the bonding interface in response to receiving the thermal energy. In some embodiments, the method further comprises heating, concurrently with applying the electric current, the first and second semiconductor dies attached to each other to a first temperature such that the first and second top surfaces of the first and second bond pads expand toward the bonding interface to directly bond to each other, where the first temperature is less than a second temperature for the first and second bond pads to directly bond to each other absent the thermal energy.

In some embodiments, the resistive heating component is a first resistive heating component and the thermal energy is a first thermal energy, and the second semiconductor die includes a second resistive heating component, and the method further comprises applying the electric current to the second resistive heating component to supply second thermal energy to at least the second bond pad such that the second top surface of the second bond pad expands toward the bonding interface. In some embodiments, a sum of the first and second thermal energy is sufficient for the first and second top surfaces of the first and second bond pads to bond to each other as a result of supplying the first and second thermal energy to the first and/or second bond pads. In some embodiments, the method further comprises heating, concurrently with applying the electric current to the first and second resistive heating components, the first and second semiconductor dies attached to each other to a first temperature such that the first and second top surfaces of the first and second bond pads expand toward the bonding interface to directly bond to each other, where the first temperature is less than a second temperature for the first and second bond pads to directly bond to each other absent the first and second thermal energy.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

14

What is claimed is:

1. A semiconductor wafer, comprising:
   a semiconductor substrate;
   a dielectric layer over the semiconductor substrate;
   a bond pad in the dielectric layer, the bond pad including an exposed top surface that is recessed with respect to a surface of the dielectric layer opposite to the semiconductor substrate; and
   a resistive heating component in the dielectric layer, wherein the resistive heating component is located proximate to the bond pad to supply thermal energy to the bond pad in response to electric current flowing through the resistive heating component,
   wherein the resistive heating component is coupled to a metallic trace that extends to at least one arcuate sidewall of the semiconductor wafer, the sidewall being generally perpendicular to the surface of the dielectric layer.

2. The semiconductor wafer of claim 1, wherein:
   the bond pad is a first bond pad of a plurality of bond pads of the semiconductor wafer; and
   the resistive heating component is a first resistive heating component of a plurality of resistive heating components of the semiconductor wafer, wherein individual resistive heating components of the plurality of resistive heating components are located proximate to corresponding bond pads of the plurality of bond pads, and wherein all the resistive heating components are connected to a single circuit.

3. The semiconductor wafer of claim 1, wherein the bond pad is configured to have the top surface of the bond pad expand toward the surface of the dielectric layer in response to receiving the thermal energy.

4. The semiconductor wafer of claim 1, wherein the bond pad is configured to have the top surface of the bond pad expand at least to the surface of the dielectric layer in response to receiving the thermal energy.

5. The semiconductor wafer of claim 1, wherein the thermal energy is a portion of total thermal energy for the top surface of the bond pad to expand at least to the surface of the dielectric layer.

6. The semiconductor wafer of claim 1, wherein the resistive heating component is electrically isolated from every external contact on a top or bottom surface of the semiconductor wafer.

7. The semiconductor wafer of claim 1, wherein the resistive heating component includes at least one of nickel alloys, NiCr alloys, FeCrAl alloys, CuNi alloys, molybdenum alloys, tungsten alloys, graphite, silicon carbides, or MoSi2.

8. The semiconductor wafer of claim 1, further comprising:
   a thermoelectric component in the dielectric layer, wherein the thermoelectric component is located proximate to the bond pad, and wherein the thermoelectric component is coupled to a temperature control circuit of the semiconductor wafer.

9. The semiconductor wafer of claim 1, further comprising:
   a thermoelectric component in the dielectric layer, wherein the thermoelectric component is located proximate to the bond pad, and wherein the thermoelectric component is coupled to another bond pad of the semiconductor wafer configured to couple with a terminal of a semiconductor die assembly including the semiconductor die.

* * * * *